United States Patent [19]
Maruta et al.

[11] Patent Number: 4,467,315
[45] Date of Patent: Aug. 21, 1984

[54] DIGITAL COMPANDOR HAVING NONLINEAR COMPANDING CHARACTERISTICS

[75] Inventors: Rikio Maruta; Atsushi Tomozawa, both of Tokyo, Japan

[73] Assignee: Nippon Electric Co., Ltd., Tokyo, Japan

[21] Appl. No.: 934,985

[22] Filed: Aug. 18, 1978

[30] Foreign Application Priority Data

Aug. 22, 1977 [JP] Japan ................................. 52-100927

[51] Int. Cl.$^3$ .......................................... H03K 13/24
[52] U.S. Cl. .............................. 340/347 DD; 235/310
[58] Field of Search ................. 340/347 DD; 235/310

[56] References Cited

U.S. PATENT DOCUMENTS

| | | | |
|---|---|---|---|
| 3,694,639 | 9/1972 | Deschenes | 340/347 DD |
| 3,707,712 | 12/1972 | Deschenes | 340/347 DD |
| 3,863,248 | 1/1975 | Deschenes | 340/347 DD |

FOREIGN PATENT DOCUMENTS 2312128  9/1974  Fed. Rep. of Germany ...... 235/310

*Primary Examiner*—C. D. Miller
*Attorney, Agent, or Firm*—Laffe, Whitesel, Conte & Saret

[57] ABSTRACT

A compandor converts a linear code signal consisting of a polarity bit and a plurality of absolute value bits. The polarity bit represents the polarity of each sample value of an original analog signal. The absolute value bits represent the absolute value of the sample. The compandor converts the linear code into a nonlinear code including the polarity bit, a plurality of segment bits representing the segments in a characteristic curve to which the original analog signal belongs, and mantissa bits which indicate the position of the sample value in that segment. The compandor comprises: a plurality of input terminals for receiving the linear code signal; a first read-only memory means, addressed by a first bit group among the absolute value bits for memorizing a segment bit decision rule; a second read-only memory means, addressed by a second bit group consisting of another plurality of bits among the absolute value bits and some bits in common with the first bit group for memorizing a first mantissa bit decision rule; a third read-only memory means, addressed by the first bit group, for memorizing a second mantissa bit decision rule; and means for selecting the second or third read-only memory means depending on the value of the most significant bit among the segment bits applied from the first read-only memory means.

1 Claim, 7 Drawing Figures

|    | $b_1$ | $b_2$ | $b_3$ | $b_4$ | $b_5$ | $b_6$ | $b_7$ | $b_8$ | $b_9$ | $b_{10}$ | $b_{11}$ | $b_{12}$ | $b_{13}$ | $b_{14}$ | $B_1$ | $B_2$ | $B_3$ | $B_4$ | $B_5$ | $B_6$ | $B_7$ | $B_8$ |
|----|---|---|---|---|---|---|---|---|---|---|---|---|---|---|---|---|---|---|---|---|---|---|
| S1 | P | 0 | 0 | 0 | 0 | 0 | 0 | 0 | W | X | Y | Z | ∅ | ∅ | P | 0 | 0 | 0 | W | X | Y | Z |
| S2 | P | 0 | 0 | 0 | 0 | 0 | 0 | 1 | W | X | Y | Z | ∅ | ∅ | P | 0 | 0 | 1 | W | X | Y | Z |
| S3 | P | 0 | 0 | 0 | 0 | 0 | 1 | W | X | Y | Z | ∅ | ∅ | ∅ | P | 0 | 1 | 0 | W | X | Y | Z |
| S4 | P | 0 | 0 | 0 | 0 | 1 | W | X | Y | Z | ∅ | ∅ | ∅ | ∅ | P | 0 | 1 | 1 | W | X | Y | Z |
| S5 | P | 0 | 0 | 0 | 1 | W | X | Y | Z | ∅ | ∅ | ∅ | ∅ | ∅ | P | 1 | 0 | 0 | W | X | Y | Z |
| S6 | P | 0 | 0 | 1 | W | X | Y | Z | ∅ | ∅ | ∅ | ∅ | ∅ | ∅ | P | 1 | 0 | 1 | W | X | Y | Z |
| S7 | P | 0 | 1 | W | X | Y | Z | ∅ | ∅ | ∅ | ∅ | ∅ | ∅ | ∅ | P | 1 | 1 | 0 | W | X | Y | Z |
| S8 | P | 1 | W | X | Y | Z | ∅ | ∅ | ∅ | ∅ | ∅ | ∅ | ∅ | ∅ | P | 1 | 1 | 1 | W | X | Y | Z |

FIG. 1

|    | $b_1$ | $b_2$ | $b_3$ | $b_4$ | $b_5$ | $b_6$ | $b_7$ | $b_8$ | $b_9$ | $b_{10}$ | $b_{11}$ | $b_{12}$ | $b_{13}$ | $b_{14}$ | $B_1$ | $B_2$ | $B_3$ | $B_4$ | $B_5$ | $B_6$ | $B_7$ | $B_8$ |
|----|---|---|---|---|---|---|---|---|---|---|---|---|---|---|---|---|---|---|---|---|---|---|
| S1 | P | 0 | 0 | 0 | 0 | 0 | 0 | 1 | W | X | Y | Z | ∅ | | P | 0 | 0 | 0 | W | X | Y | Z |
| S2 | P | 0 | 0 | 0 | 0 | 0 | 1 | W | X | Y | Z | ∅ | ∅ | | P | 0 | 0 | 1 | W | X | Y | Z |
| S3 | P | 0 | 0 | 0 | 0 | 1 | W | X | Y | Z | ∅ | ∅ | ∅ | | P | 0 | 1 | 0 | W | X | Y | Z |
| S4 | P | 0 | 0 | 0 | 1 | W | X | Y | Z | ∅ | ∅ | ∅ | ∅ | | P | 0 | 1 | 1 | W | X | Y | Z |
| S5 | P | 0 | 0 | 0 | W | X | Y | Z | ∅ | ∅ | ∅ | ∅ | ∅ | | P | 1 | 0 | 0 | W | X | Y | Z |
| S6 | P | 0 | 0 | 1 | W | X | Y | Z | ∅ | ∅ | ∅ | ∅ | ∅ | | P | 1 | 0 | 1 | W | X | Y | Z |
| S7 | P | 0 | 1 | W | X | Y | Z | ∅ | ∅ | ∅ | ∅ | ∅ | ∅ | | P | 1 | 1 | 0 | W | X | Y | Z |
| S8 | P | 1 | W | X | Y | Z | ∅ | ∅ | ∅ | ∅ | ∅ | ∅ | ∅ | | P | 1 | 1 | 1 | W | X | Y | Z |

FIG. 2

DIGITAL COMPANDOR HAVING NONLINEAR COMPANDING CHARACTERISTICS

This invention relates to digital compandors, especially for use in pulse code modulation ("PCM") systems. The inventive compandor converts a linear, quantized, digital code signal ("linear code signal") obtained by a linear-quantization coding of an original analog signal into a nonlinear, quantized, digital code signal ("nonlinear code signal").

Generally, PCM communication systems vary the step size nonlinearly for the quantizing levels of an input analog signal on the transmitting side, in accordance with the level of the input signal. Thus, nonlinear-quantization coding may be achieved without affecting the signal to noise ratio, but there is a reduction in the amount of information that is transmitted.

The "International Conference on Communication Record," 1971 issue, pp. 22-10 to 22-15, describes a nonlinear-quantization coding equipment for directly obtaining a nonlinear code signal from an input analog signal.

More recently, however, another type of coding equipment has been proposed for securing greater freedom in designing and for enabling an extensive use of integrated circuits ("IC's"). This equipment encodes the input analog signal, using a linear quantization characteristic, and then converts the resultant linear code signal into a nonlinear code signal through a use of a digital compandor. One example of such equipment is described in "The Bell System Technical Journal, Vol. 49, No. 7," Sept. issue, 1970, pp. 1555–1588.

The nonlinear code signal obtained by this process is re-converted into the linear code signal by a decoder, which is on the receiving side. Then, the linear code is decode into the original input analog signal.

The "IEEE Transactions on Communication Technology, Vol. COM-19, No. 6," Dec. issue, 1971, pp. 1076–1087, gives details about one example of an application of a digital compandor used in coding equipment, as applied, to another system. As seen on pages 1077 and 1081, there is an attempt to use digital echo cancellers and digital filters in the channel filters of PCM communication systems. Another example uses a digital compandor at the linear code signal stage for converting into nonlinear code signal after the echo cancellation and the digital filtering have been accomplished. However, the hardware of this digital compandor becomes complicated since it uses a large number of IC's, with a resulting increase in the cost of manufacture.

Another digital compandor is found in the transmultiplexer described in the "IEEE Transactions on Communications, Vol. COM-22, No. 9,"Sep. issue, 1974, pp. 1199–1205. This transmultiplexer is used as an interface for interconnecting an FDM circuit and a TDM circuit. Since linear code signals are used to facilitate the digital filtering operation for the interconnection, the linear code signals are first filtered and then are compressed by the digital compandor before they are fed to the PCM channels. However, with this use of digital compandor, the above-mentioned disadvantages are unavoidable.

To avoid these shortcomings, it is conceivable to make the compander from a read-only memory ("ROM"). However, that would require a sufficiently large memory to store a $2^{12}$ —or $2^{13}$ —word linear/nonlinear code conversion table, thereby creating a compandor which is so large that it is impractical.

Therefore, an object of the present invention is to provide a digital compander which is capable of converting between linear and nonlinear code signals without requiring large capacitor ROM's.

The present compander converts a linear into a nonlinear code signal consisting of a polarity bit and a plurality of absolute value bits. The polarity bit represents the polarity and the absolute value bits represent the absolute value of an original analog signal sample. The nonlinear code signal also includes a plurality of segment bits representing the segment of a memorized curve to which the sample of the original analog signal belongs, and mantissa bits which indicate the position of the sample value within the segment.

The compander comprises: a plurality of input terminals for receiving the linear code signal; a first read-only memory means which is addressed by a first bit group among the absolute value bits, for memorizing a segment bit decision rule; a second read-only memory means which is addressed by a second bit group among the absolute value bits, and some bits in common with the first bit group, for memorizing a first mantissa bit decision rule; a third read-only memory means which is addressed by the first bit group for memorizing a second mantissa bit decision rule; and means for selecting the second or third read-only memory means depending on the value of the most significant bit among the segment bits supplied from the first read-only memory means.

Next, this invention will be described in detail in conjunction with the accompanying drawings, in which:

FIG. 1 is a linear-to-nonlinear code signal conversion table based on the A-law described in the above-cited Bell System Technical Journal;

FIG. 2 is a linear-to-nonlinear code signal conversion table based on the $\mu$-law also described in the Bell System Technical Journal;

First, the principle of linear/nonlinear code conversion of this invention will be described with reference to FIGS. 1 and 2.

In a linear code, when the more significant bits $b_2$–$b_9$ (FIG. 1) are "00000001" or smaller, the segment bits $B_2$–$B_4$ are "000." When the more significant bits are "00000010" or "00000011," the segment bits are "001." Similarly, when the significant bits are "00000100," "00000101," "00000110" or "00000111," the segment bits $B_2$–$B_4$ are "010." Therefore, in converting such a linear code into a nonlinear code, the identity of the segment bits $B_2$–$B_4$ can be determined from the more significant bits $b_2$–$b_9$. When the most significant bit ("MSB") $B_2$ of the segment bits is "0," the mantissa bits $B_5$–$B_8$ can be determined by the intermediate bits $b_6$–$b_{13}$ which have three bits $b_6$–$b_8$ in common with the more significant bits. When the bit $B_2$ is "1," the mantissa bits $B_5$–$B_8$ can be determined by the more significant bits $b_2$–$b_9$.

A feature of this invention lies in using such a characteristic of the linear code. Thus, in this invention, the segment bits $B_2$–$B_4$ of the nonlinear code are first determined from the more significant bits $b_2$–$b_9$ of the linear code which is to be converted. Then, the mantissa bits $B_5$–$B_8$ are determined from either the more significant bits $b_2$–$b_9$ or the intermediate bits $b_6$–$b_{13}$ depending on the value of the MSB $B_2$ of the segment bits.

Figure 3:
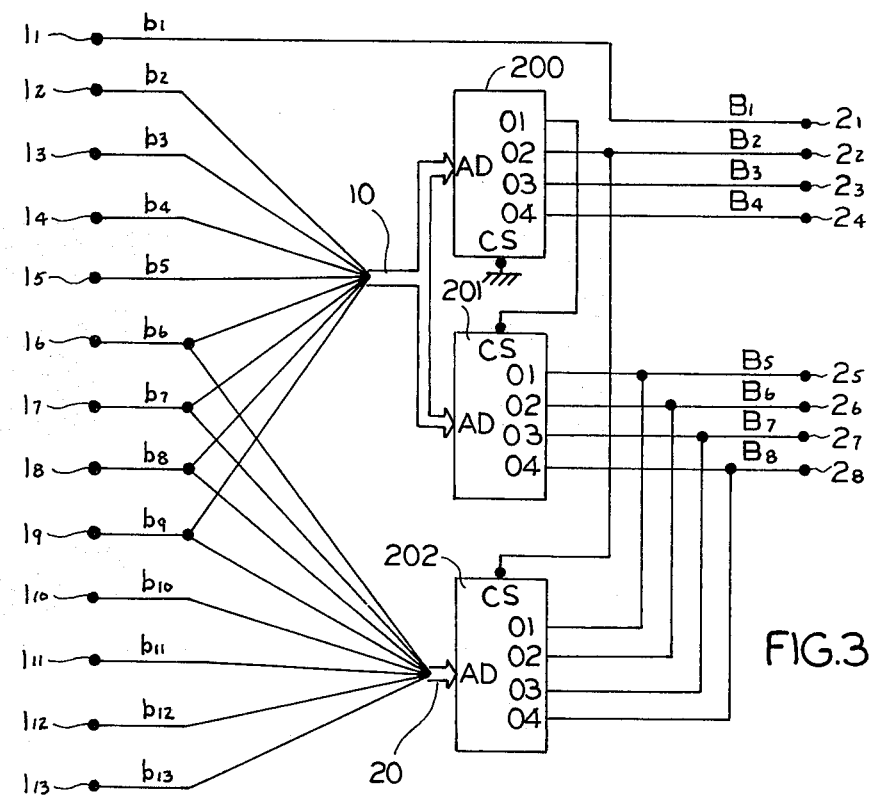
FIG. 3 is a block diagram which shows a first embodiment of the invention.

In FIG. 3, the present digital compandor has input terminals $1_1$–$1_{13}$ for receiving a linear code comprising a polarity bit representing the polarity of the sample value of one of the original analog signals and twelve-absolute value bits representing the absolute value of the same sample value. A read only memory ("ROM") determines the segment bits $B_2$–$B_4$ based on the more significant bits $b_2$–$b_9$ of the linear code which is supplied to the input terminals. This ROM 200 memorizes a segment bit decision rule by which the $2^8=256$ code patterns expressed by the eight bits $b_2$ through $b_9$, which are classified into eight segments $S_1$ through $S_8$ which, in turn, are expressed as three bits, as shown in FIG. 1. The same segment bits are assigned to code patterns belonging to the same segment. For instance, the code patterns "00000100," "00000101", "00000110" and "00000111" all belong to the segment $S_3$ indicated as "000001WX" in FIG. 1. Responsive thereto, the ROM 200 provides the common segment bits "010."

The ROM 200 further has a terminal (01) for outputting the inverted code of the MSB $B_2$ of the segment bits and a chip selecting terminal CS for receiving chip selection signals. This terminal CS is grounded so that output signals are constantly given to the output terminals (01) through (04).

A ROM 202 is selected by a "0" of the MSB $B_2$ given from the ROM 200 through the chip-selecting terminal CS in order to memorize a mantissa bit decision rule by which the maintissa bits $B_5$ through $B_8$ are determined on a basis of the intermediate bits $b_6$ through $b_{13}$ which are supplied to the input terminal $1_6$ through $1_{13}$.

More specifically, this mantissa bit decision rule classifies the 256 code patterns expressed by the eight intermediate bits of $b_6$ through $b_{13}$ into the segments $S_1$ through $S_8$, to give WXYZ bits (see FIG. 1) in the code patterns belonging to each of the segments $S_1$ through $S_4$, as mantissa bits $B_5$ through $B_8$. This decision rule also gives all zeros for every code pattern belonging to the segments $S_5$ through $S_8$. For instance, for the code pattern "01$W_1X_1Y_1Z_1$" belonging to the segment $S_3$, the code "$W_1X_1 Y_1Z_1$ is provided as the mantissa bits $B_5$ through $B_8$.

A ROM 201 is selected if the chip selecting terminal CS is fed with "0," as the inverted code of the MSB $B_2$ of the segment bits given from the ROM 200, to memorize a mantissa bit decision rule. By this rule, the mantissa bits $B_5$ through $B_8$ are determined on the basis of the more significant bits $b_2$ through $b_9$ which are supplied to the input terminals $1_2$ through $1_9$. Stated in detail, this mantissa bit decision rule classifies the 256 code patterns expressed by eight bits $b_2$ through $b_9$ into the segments $S_1$ through $S_8$, to give the WXYZ bits of each code pattern belonging to the segments $S_5$ through $S_8$, as the mantissa bits $B_5$ through $B_8$, and to give all zeros to every pattern belonging to the segments $S_1$ through $S_4$.

The output signals of these ROM's 201 and 202 are supplied to the mantissa bit ouput terminals $2_5$ through $2_8$. Meanwhile, the polarity bit given to the polarity bit output terminal $2_1$ is in the same form that it was given to the input terminal $1_1$.

Figure 4:
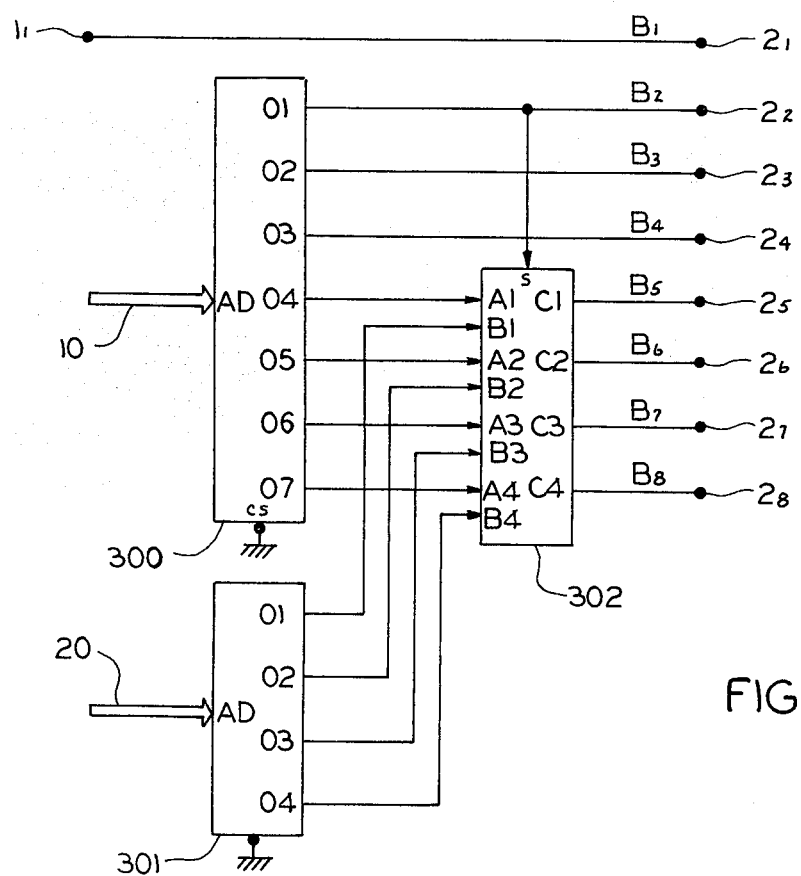
FIG. 4 is a block diagram of a second embodiment of the invention.

In the digital compandor of FIG. 4, the switching operation between the ROM's 200 and 201 of FIG. 3 is carried out by a selector circuit 302. More in detail, a ROM 301 memorizes the same rule that is memorized by the ROM 202 of FIG. 3. The ROM 300 has a capacity of 256 words$\times$7 bits. The same rule that is stored in the ROM 201 of FIG. 3 is also stored in the memory area corresponding to the output terminals (04), (05), (06) and (07) of this ROM 301. The same rule that corresponds to the output terminals (802), (03) and (04) of the ROM 200 of FIG. 3 is stored in the memory area corresponding to the output terminals (01) through (03) of ROM 300.

The selector 302 switches between the output terminals (04–06) of the ROM 300 and output terminals (01–04) of the ROM 301, depending on the value of the MSB $b_2$ of the segment bits of the ROM 300. Output terminals $C_1$ through $C_4$ of selector 302 are connected to the segment bit, output terminals $2_5$ through $2_8$, respectively.

Figure 5:
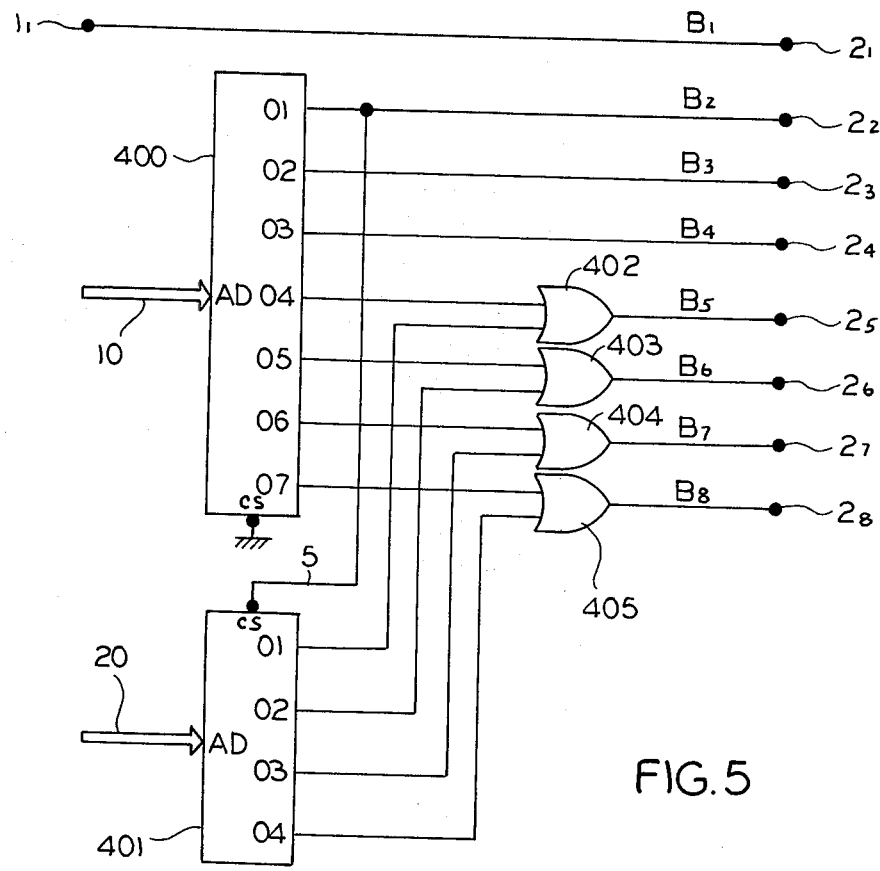
FIG. 5 is a block diagram which shows a third embodiment of the invention.

The digital compandors of FIGS. 4 and 5 have the same structure, except that the selector 302 of FIG. 4 is replaced by OR circuits 402 through 405 of FIG. 5. ROM's 400 and 401 store the same mantissa bit decision rule that the ROM's 300 and 301 (FIG. 4) store.

Figure 6:
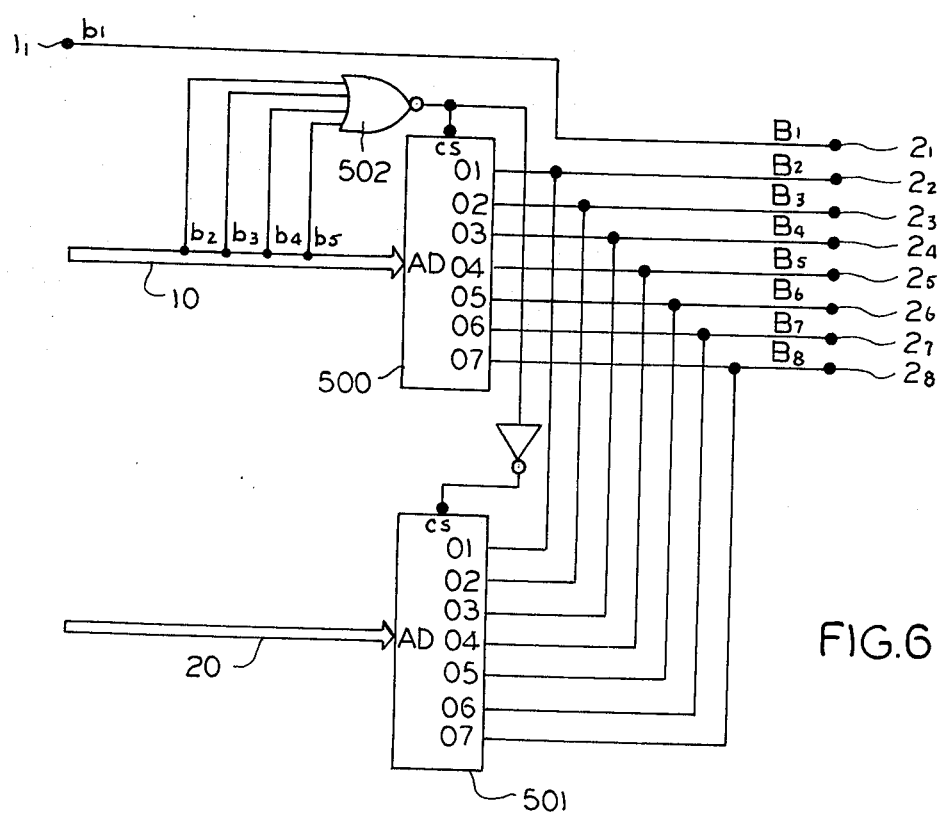
FIG. 6 is a block diagram of a fourth embodiment of the invention.

The digital compandor of FIG. 6 has a NOR circuit 502 for deciding the MSB $B_2$ of the segment bits. A ROM 500, which is selected when the value of the bit $B_2$ of NOR circuit 502 is "0," memorizes the rule by which nonlinear codes are derived from the more significant bits 10. A "1" in the MSB($B_2$) of the segment bits selects the ROM 501 which memorizes the rule by which nonlinear codes are derived from the less significant bits 20.

The input linear code, consisting of a polarity bit and absolute value bits, is converted into the A-law nonlinear code, in the embodiments described above. It is easy to convert the input linear code signals into the $\mu$-law nonlinear code signals by altering the rules memorized in the ROM's of FIGS. 3 to 6, according to the table of FIG. 2.

Furthermore, while input linear code signals are represented by polarity and absolute value bits in the various embodiments, linear code signals represented by a two's complement can be converted into nonlinear code signals by the present digital compandor, if they are first converted through a preprocessor into linear code signals consisting of polarity and absolute value bits. For the details of the linear code signals represented by a two's complement, reference is made to pages 10 to 13 of the "Digital Computer Design Fundamentals" published by McGraw-Hill Book Company, Inc in 1962.

Figure 7:
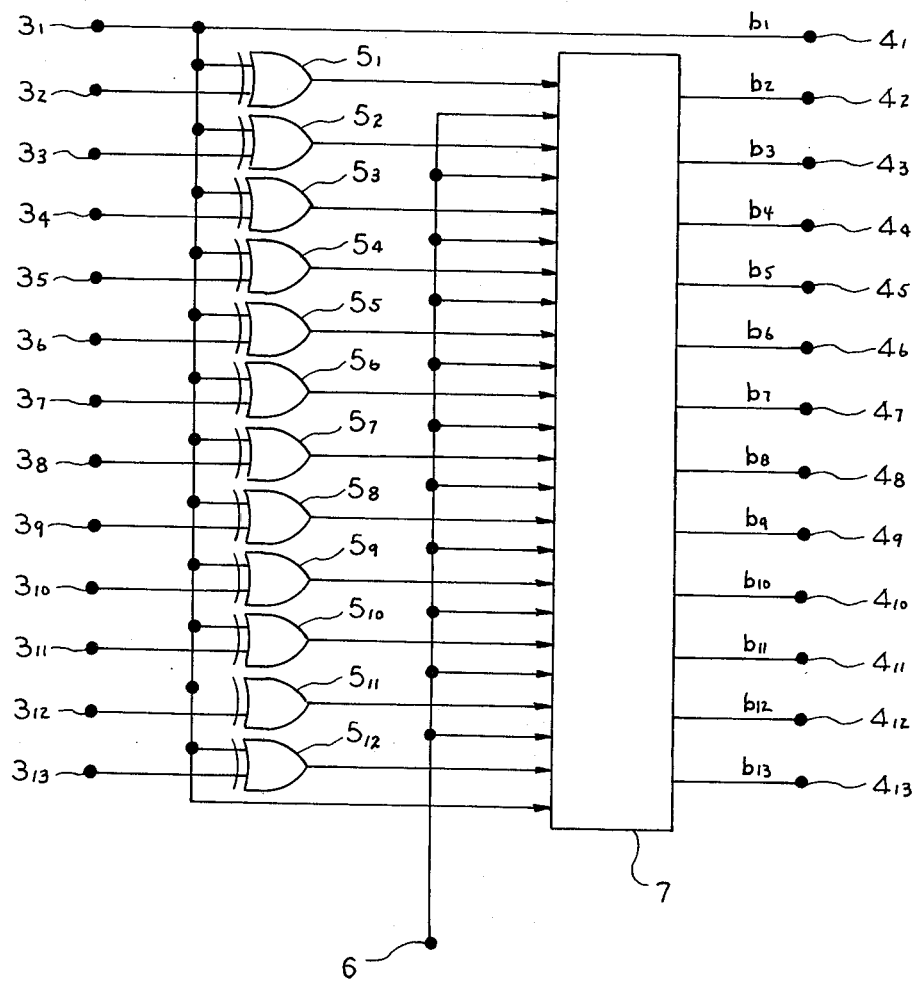
FIG. 7 is a logic circuit diagram of part of the first through fourth embodiments.

The preprocessor circuit (FIG. 7) has input terminals $3_1$ through $3_{13}$ for receiving code signals expressed in two's complement. Exclusive OR circuits (EXOR's) $5_1$ through $5_{12}$ invert the bits of the terminals $3_2$ through $3_{13}$ when the MSB fed to the input terminal $3_1$ is "(e) 1" and output the bits of the terminals $3_2$ through $3_{13}$ directly as they are when the MSB is "0." An adder 7 adds the decimal 1 to the output signals of these EX-OR's when the MSB is "1." Reference number 6 corresponds to a terminal which gives "0" to the input terminals of the adder 7 corresponding to the second to the 12th bits to enable the adder 7 to add decimal one.

As described above, the present digital compandor consists of only two or three small-capacity ROM's, and contributes greatly to reducing the system size, and consequently the cost to manufacture.

Those who are skilled in the art will readily perceive how to modify the system. Therefore, the appended claims are to be construed to cover all equivalent structures.

We claim:

1. A digital compandor for converting a linear code signal into a nonlinear code signal, said linear code signal including a polarity bit which represents the polarity of each sample value of an original analog signal and a plurality of absolute value bits which represent the absolute value of the sample, said nonlinear code signal including said polarity bit, a plurality of segment bits which identify one of a plurality of segments to which said sample value of the original analog signal belongs and mantissa bits which are indicative of the position of said sample value in said identified segment, said compandor comprising: a plurality of input terminal means for receiving said linear code signal; a first read-only memory means which is addressable by a first bit group including a predetermined plurality of bits among said absolute value bits for memorizing a segment bit decision rule by which said segment bits are determined responsive to said first bit group; a second read-only memory means which is addressable by a second bit group including another plurality of bits among said absolute value bits and having some bits in common with said first bit group for memorizing a first mantissa bit decision rule by which said mantissa bits are determined responsive to said second bit group; a third read-only memory means addressable by said first bit group for memorizing a second mantissa bit decision rule by which mantissa bits are determined responsive to said first bit group; and means for selecting said second or third read-only memory means responsive to the value of the most significant bit among the segment bits supplied by said first read-only memory means.

* * * * *